(12) United States Patent
Mauder et al.

(10) Patent No.: US 8,089,768 B2
(45) Date of Patent: Jan. 3, 2012

(54) COMPONENT ARRAGEMENT WITH AN OPTIMIZED ASSEMBLY CAPABILITY

(75) Inventors: Anton Mauder, Kolbermoor (DE); Wolfgang Scholz, Olching (DE)

(73) Assignee: Infineon Technologies AG, Munich (DE)

( * ) Notice: Subject to any disclaimer, the term of this patent is extended or adjusted under 35 U.S.C. 154(b) by 356 days.

(21) Appl. No.: 11/659,297

(22) PCT Filed: Jul. 14, 2005

(86) PCT No.: PCT/EP2005/007675
§ 371 (c)(1),
(2), (4) Date: Dec. 1, 2008

(87) PCT Pub. No.: WO2006/015685
PCT Pub. Date: Feb. 16, 2006

(65) Prior Publication Data
US 2009/0213552 A1 Aug. 27, 2009

(30) Foreign Application Priority Data
Aug. 3, 2004 (DE) .......................... 10 2004 037 656

(51) Int. Cl.
*H05K 7/20* (2006.01)
*H01L 23/36* (2006.01)

(52) U.S. Cl. ...... 361/709; 361/719; 165/80.2; 165/80.3; 165/104.33; 439/75; 439/487; 439/801

(58) Field of Classification Search .............. 439/70–71, 439/75, 487, 801; 361/709, 719; 165/80.2, 165/80.3, 104.33
See application file for complete search history.

(56) References Cited

U.S. PATENT DOCUMENTS

| 4,587,377 | A |   | 5/1986  | Rodseth et al. |
|-----------|---|---|---------|----------------|
| 4,914,551 | A | * | 4/1990  | Anschel et al. ............... 361/714 |
| 5,007,841 | A | * | 4/1991  | Smolley .......................... 439/66 |
| 5,237,485 | A |   | 8/1993  | Cognetti de Martiis et al. |
| 5,473,510 | A | * | 12/1995 | Dozier, II ...................... 361/719 |
| 5,730,620 | A | * | 3/1998  | Chan et al. .................... 439/526 |
| 5,738,531 | A | * | 4/1998  | Beaman et al. ................. 439/71 |
| 5,757,621 | A | * | 5/1998  | Patel ............................. 361/719 |
| 5,805,430 | A |   | 9/1998  | Atwood et al. |
| 5,833,472 | A | * | 11/1998 | Bright ............................. 439/70 |
| 5,926,371 | A | * | 7/1999  | Dolbear ........................ 361/704 |
| 5,985,697 | A | * | 11/1999 | Chaney et al. ................ 438/122 |
| 6,023,413 | A | * | 2/2000  | Umezawa ...................... 361/697 |
| 6,074,219 | A | * | 6/2000  | Tustaniwskyj et al. ......... 439/66 |

(Continued)

FOREIGN PATENT DOCUMENTS
DE  33 42 924 A1  6/1985
(Continued)

*Primary Examiner* — Anatoly Vortman
(74) *Attorney, Agent, or Firm* — Maginot, Moore & Beck

(57) ABSTRACT

The invention relates to a component arrangement. In at least one embodiment, the component arrangement comprises: an electronics module; a heat sink contacted by the electronics module; a printed circuit board, and; a fastening means for fastening the electronics module to the printed circuit board and to the heat sink. The electronics module has at least one elastic connecting limb for the solder-free contacting of the electronics module with the printed circuit board and has a location for the fastening means. The electronics module additionally comprises a decoupling means for decoupling the force of pressure between the connecting limb and the printed circuit board from the contact force between the heat sink and the electronics module. In at least one embodiment of the invention an electronics module is provided that can be used in the aforementioned component arrangement.

20 Claims, 3 Drawing Sheets

U.S. PATENT DOCUMENTS

| | | | |
|---|---|---|---|
| 6,154,365 A * | 11/2000 | Pollard et al. | 361/704 |
| 6,222,731 B1 * | 4/2001 | Katsui | 361/697 |
| 6,223,815 B1 * | 5/2001 | Shibasaki | 165/185 |
| 6,304,450 B1 * | 10/2001 | Dibene et al. | 361/704 |
| 6,349,032 B1 * | 2/2002 | Chan et al. | 361/704 |
| 6,417,532 B2 * | 7/2002 | Tsunoda et al. | 257/219 |
| 6,459,582 B1 * | 10/2002 | Ali et al. | 361/704 |
| 6,545,879 B1 * | 4/2003 | Goodwin | 361/807 |
| 6,580,613 B2 | 6/2003 | Frankowsky | |
| 6,633,489 B2 * | 10/2003 | Callahan et al. | 361/771 |
| 6,903,941 B2 * | 6/2005 | Paola | 361/803 |
| 6,920,052 B2 * | 7/2005 | Callahan et al. | 361/767 |
| 6,936,919 B2 * | 8/2005 | Chuang et al. | 257/717 |
| 7,209,354 B2 * | 4/2007 | Wu et al. | 361/697 |

FOREIGN PATENT DOCUMENTS

| | | |
|---|---|---|
| DE | 198 32 450 A1 | 1/2000 |
| DE | 196 30 173 C2 | 2/2001 |
| DE | 102 31 219 C1 | 5/2003 |
| JP | 58-204560 | 11/1983 |
| JP | 2002 111250 | 4/2002 |
| WO | WO 00/35262 | 6/2000 |
| WO | WO 2006/015685 A3 | 2/2006 |

\* cited by examiner

COMPONENT ARRAGEMENT WITH AN OPTIMIZED ASSEMBLY CAPABILITY

CROSS-REFERENCE TO RELATED APPLICATIONS

This application is a national phase of international patent application number PCT/EP2005/007675 filed Jul. 14, 2005, which claims priority from German application No. 10 2004 037 656.5-33, filed Aug. 3, 2004.

FIELD

The invention relates to a component arrangement comprising an electronics module, a heat sink and a printed circuit board.

BACKGROUND

Electronics modules of this type are often soldered to the printed circuit board and fastened on the heat sink by screws or clips. In particular if the electronics modules have an enclosed package, thermal stresses may occur at the soldered connection or where the leads enter the package, and may cause crack formation at the solder or at the package and consequently failure of the electronics module. Although it is possible to reduce this risk by careful assembly, the assembly-related costs increase as a result.

In addition, depending on the assembly concept, it may be necessary for the electronics module to be electrically contacted in a separate soldering step, which likewise involves additional costs.

Although the risk of crack formation as mentioned above can be reduced to an acceptable level by the use of thermoplastic packages, these thermoplastic packages do not withstand the high temperatures during wave soldering, so that once again a separate, complex soldering step is required for the assembly of the electronics module.

In the case of an alternative embodiment, springs are inserted into the thermoplastic package of an electronics module and electrically contact the printed circuit board with a substrate of the electronics module that is arranged in the thermoplastic package. In this case, it is necessary to press the electronics module against the printed circuit board with a certain force, produced for example by means of a screw fitting.

In order that this does not cause deformation of the printed circuit board because of the pressing force required for the contacting of the heat sink, a large-area, mechanically stable stay must be fastened on the side of the printed circuit board that is facing away from electronics module, on the one hand requiring assembly effort and on the other hand using up considerable space on the printed circuit board.

U.S. Pat. No. 6,580,613 B2 discloses an electronics assembly in which one or more semiconductor chips can be contacted in a solder-free manner with a printed circuit board by means of conducting terminals. The pressing force for the solder-free contacting is in this case produced by a frame, which at the same time serves as a heat sink. This arrangement has the disadvantage that the pressing force between the conducting terminals and the printed circuit board is not decoupled from the pressing force between the semiconductor chips and the heat sink.

WO 00/35262 shows a method for mounting an electronic component. For this purpose, the electronic component, which has spring contacts for the electrical contacting, is placed in a holder and held in it by means of a cover. The holder with the electronic component is placed or swung onto a carrier and contacted with contact areas of the carrier. Arranged between the electronic component and the carrier is a strip which does not constitute part of the electronic component.

Accordingly, it would be advantageous to provide a component arrangement in which an electronics module is electrically connected in a solder-free manner to a printed circuit board and thermally connected to a heat sink in an easy way. It would also be advantageous to provide an electronics module which is suitable for use in a component arrangement of this type.

SUMMARY

A component arrangement according to at least one embodiment of the invention comprises an electronics module, a heat sink contacted with the electronics module, a printed circuit board, and a fastening means for the preferably permanent fastening of the electronics module with the printed circuit board and the heat sink. In this case, the electronics module has at least one elastic lead for the solder-free contacting of the electronics module with the printed circuit board and also a receptacle for the fastening means. Furthermore, the electronics module comprises a decoupling means for decoupling the compressive force between the lead and the printed circuit board from the pressing force between the heat sink and the electronics module.

In at least one embodiment of the invention, the electronics module can be electrically contacted with a printed circuit board and thermally contacted with a heat sink by a fastening means. It has at least one elastic lead for the solder-free contacting of the electronics module with the printed circuit board and also a receptacle for the fastening means. Furthermore, the electronics module comprises a decoupling means for decoupling the compressive force between the lead and the printed circuit board from the pressing force between the heat sink and the electronics module.

BRIEF DESCRIPTION OF THE DRAWINGS

The invention is explained in more detail below on the basis of figures, in which.

Unless otherwise indicated, in the figures the same reference numerals designate the same parts with the same meaning.

DESCRIPTION

Figure 1:
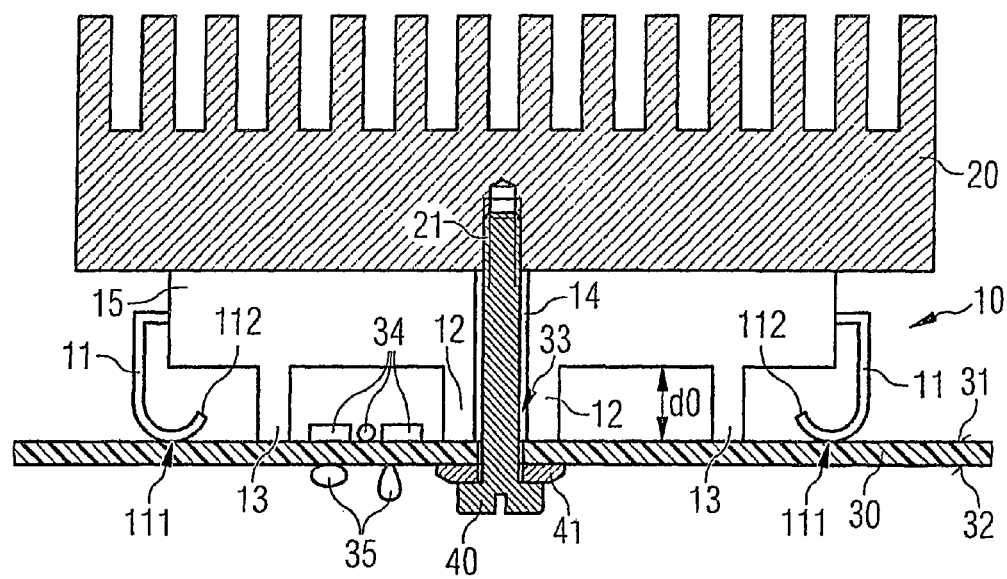
FIG. 1 shows a cross section through a component arrangement according to the invention, in which leads are led out laterally from the electronics module, in cross section.

The component arrangement represented in FIG. 1 comprises an electronics module 10 with a package 15. Protruding laterally from the package 15 are angled-away leads 11, which extend in the direction of a printed circuit board 30 and contact the electronics module 10 with a metallization (not represented any more specifically) on the front side 31 of the printed circuit board 30 in a solder-free manner at contact points 111. The contact points 111 are preferably located on curved portions of the leads 11. However, the ends 112 of the leads 11 may similarly form the contact points 111.

On its side facing away from the printed circuit board 30, the electronics module 10 is thermally contacted with a heat sink 20. In order that good heat transfer between the electronics module 10 and the heat sink 20 is ensured, the two must be pressed against one another with high force. The pressing force required for this purpose is produced by a fastening means 40 formed as a screw, in order to ensure a permanent connection of these components.

The screw connects the heat sink 20, the printed circuit board 30 and also the electronics module 10 arranged between the latter to one another and produces both the pressing force required for the thermal contacting between the electronics module 10 and the heat sink 20 and the pressing force required for the electrical, solder-free contacting between the leads 11 and the front side 31 of the printed circuit board 30.

In order that proper, solder-free electrical contacting of the electronics module 10 with the front side 31 of the printed circuit board 30 is ensured, this pressing force must not be too low or too high.

In the case of a pressing force that is too low, the contacting between the lead 11 and the printed circuit board 30 is too poor to transfer high currents that are sometimes over 10 amperes or even in excess of 100 amperes. It is therefore necessary for the lead 11 to have a certain prestress.

If, on the other hand, the pressing force is too great, the range of elasticity of the resilient lead 11 may be exceeded, and permanent deformation of the same may consequently occur. In this case, too, the electrical contacting between the lead 11 and the printed circuit board 30 would be impaired, since the elastic properties of a material operated outside its range of elasticity change significantly.

Therefore, in order to limit the pressing force acting between the lead 11 and the printed circuit board 30, first and second decoupling means 12, 13 are arranged between the package 15 of the electronics module 10 and the printed circuit board 30. These decoupling means 12, 13 are formed as spacers, ensure a minimum spacing d0 between the front side 31 of the printed circuit board 30 and the package 15 of the electronics module 10, and thereby limit the pressing force of the leads 11 against the printed circuit board 30. According to a preferred embodiment, the first and second decoupling means 12, 13 are of the same length d1. Furthermore, with preference at least one of the decoupling means 12, 13, with particular preference each of them, is formed in one piece with the package of the electronics module 10.

Figure 3:
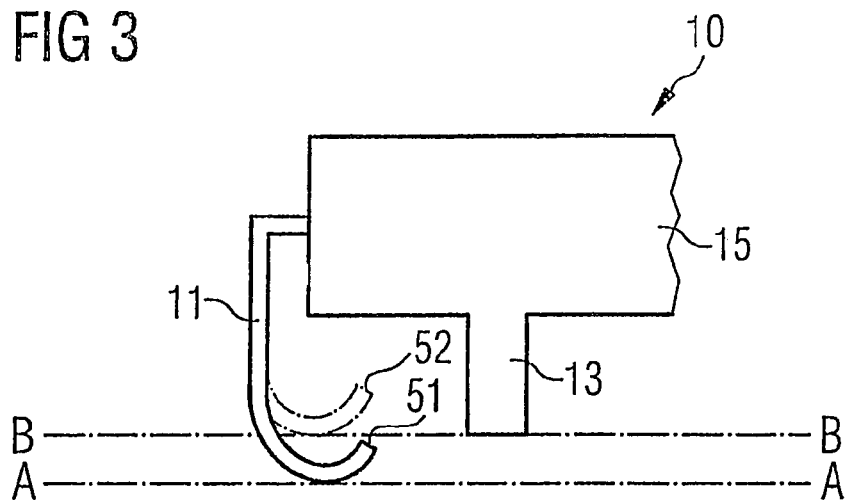
FIG. 3 shows a portion of an electronics module with a laterally led-out lead in side view.

The second decoupling means 13 in particular also has the effect of limiting the prestress of the lead 11 with respect to the printed circuit board 30, as shown on the basis of FIG. 3. FIG. 3 shows a portion of the electronics module 10 represented in FIG. 1. However, in this view the electronics module 10 is not yet connected to the printed circuit board 30. Therefore, the lead 11 assumes a relaxed position 51, in which it extends as far as a level A.

If the electronics module 10 is connected to a printed circuit board 30 in the way described on the basis of FIG. 1, the lead 11 is brought out of its relaxed position 51 into a prestressed position 52 by the printed circuit board 30 and then extends only as far as a level B, which then coincides with the front side 31 of the printed circuit board 30 according to FIG. 1. The contact points 111, shown in FIG. 1, between the front side 31 of the printed circuit board 30 and the leads 11 are arranged with preference between the package 15 and the printed circuit board 30, so that sufficient space for loading with other components remains on it alongside the electronics module 10.

In the case of the component arrangement according to FIG. 1, the fastening means 40 is formed by way of example as a screw. The screw is led through an opening 33 in the printed circuit board 30 and also through a receptacle 14 formed as a channel and is screwed with a thread 21 of the heat sink 20. One advantage of this arrangement is that the fastening means 40 does not protrude laterally beyond the package 15 of the electronics module 10.

The first decoupling means 12 are in this case arranged in the direct vicinity of the screw. This measure ensures that the force introduced by the fastening means 40 is absorbed by the first decoupling means 12 and also by the portions 151 of the package 15 that are arranged between said first decoupling means and the heat sink 20. This avoids flexing or rupturing of the printed circuit board 30 as a result of the force brought about by the screwed connection. The typical resistance to pressure of a printed circuit board 30 used in the case of a component arrangement according to the invention, for example a printed circuit board of epoxy glass-fiber materials, lies between 120 N/mm$^2$ and 200 N/mm$^2$.

Moreover, this type of fastening does not require a large-area stay in the same way as the component arrangement according to the prior art. As a result, more space remains available for mounting further electronic components 35 on the rear side 32 of the printed circuit board 30.

In order to distribute better the force introduced from the head of the screw onto the printed circuit board 30 and protect the printed circuit board 30 from mechanical damage, with preference a shim 41 is arranged between the head of the screw and the rear side 32 of the printed circuit board 30. Instead of or in addition to the shim, a spring washer or disk washer may also be provided to compensate for thermomechanical stresses. Screwing in the screw brings about a non-positive connection between the printed circuit board 30, the electronics module 10 and the heat sink 20.

The second decoupling means 13 are also intended in particular to avoid tilting of the electronics module 10 with the placed-on heat sink 20 with respect to the printed circuit board 30. Therefore, the second decoupling means 13 are spaced apart from one another and also from the first decoupling means 12 in the lateral direction. This creates regions that are arranged between the first and second decoupling means 12, 13 and are bounded in the vertical direction by the printed circuit board 30 and by the package 15 of the electronics module 10. Within these regions, the printed circuit board 30 can be loaded with further electronic components 34 on its front side 31, which leads to optimum utilization of the space on the printed circuit board 30.

Figure 2:
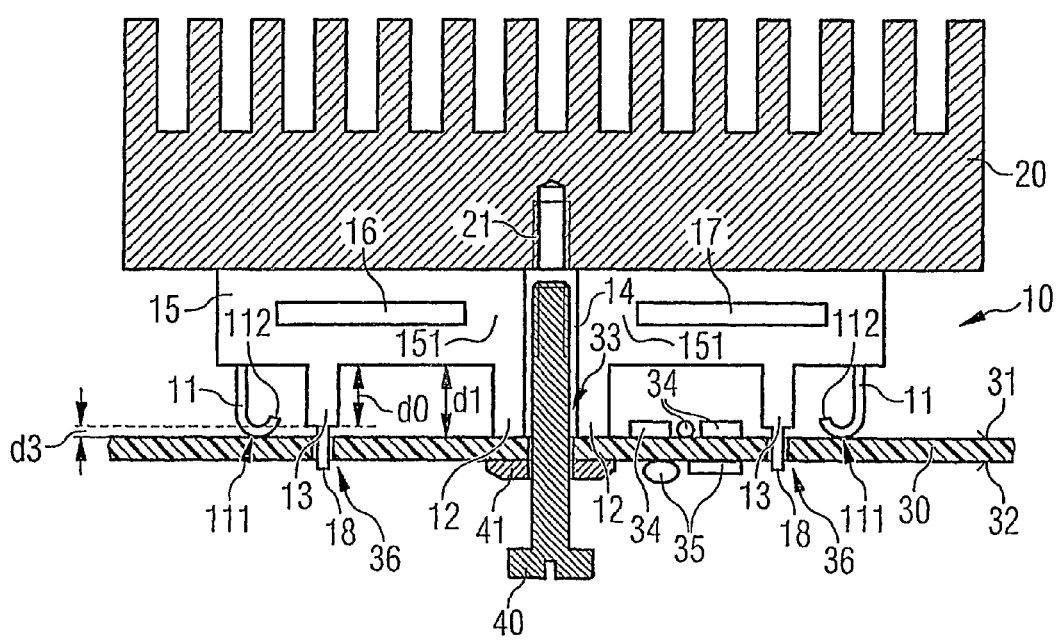
FIG. 2 shows a component arrangement according to the invention in which leads are led out on the underside of the electronics module, in cross section.

FIG. 2 shows another preferred embodiment of a component arrangement according to the invention. As a difference from the component arrangement according to FIG. 1, the leads 11 are not led out laterally from the electronics module but on the underside of the package 15. The advantage of this arrangement is that the leads 11 are placed entirely underneath the package 15 and do not protrude laterally beyond it, so that the region of the printed circuit board 30 to the side of the package 15 is available for loading with other components.

A difference from the component arrangement according to FIG. 1 is that the printed circuit board 30, the electronics module 10 and the heat sink 20 are not yet firmly screwed to one another. The first and second decoupling means 12 and 13 are of different lengths d1 and d0, respectively, the length d1 of the first decoupling means 12 being greater than the length d0 of the second decoupling means 13. If the first decoupling means 12 are formed from an elastic material, they can elastically deform when the non-positive connection is produced between the printed circuit board 30, the electronics module 10 and the heat sink 20. As a result, its original length d1 is reduced and the electronics module is reliably pressed against the heat sink by means of this spring force. As an alternative to a deformable decoupling means 12, the force transfer to the fastening means 40 may also take place by means of a resilient element (for example a spring washer or disk washer).

According to a preferred embodiment, the first and second decoupling means 12, 13 are then of the length d0 of the second decoupling means 13. This measure ensures that the force introduced by the fastening means 40 is absorbed by the first decoupling means 12 and also by the portions of the package 15 that are arranged between said first decoupling means and the heat sink 20.

According to a preferred embodiment, the first and/or second decoupling means 12, 13 have continuations 18, which engage in bores 36 in the printed circuit board 30, which simplifies the positioning of the electronics module 10 on the printed circuit board 30 during assembly. At the same time, the continuations 18 secure the electronics module 10 against twisting on the printed circuit board 30. The lengths of the continuations 18 are not included in the calculation when determining the lengths d1, d0 of the first and second decoupling means 12, 13, since the lengths d1, d0 of the decoupling means 12, 13 are "effective" lengths, by which the spacing between the package 15 of the electronics module 10 and the front side 31 of the printed circuit board 30 is determined.

The component arrangement according to the invention makes it possible to connect an electronics module 10, a heat sink 20 and a printed circuit board 30 to one another by means of a single fastening means 40, which simplifies assembly considerably. In this case, the fastening means 40 is arranged with preference substantially in the middle of the electronics module 10. If, as represented, the fastening means 40 is formed as a screw, various assemblies of the electronics module 10, for example a power section 16 and a control unit 17, may be arranged around the screw, so that it is not necessary to provide one of the assemblies 16 or 17 with an opening for leading the screw through.

Figure 4:
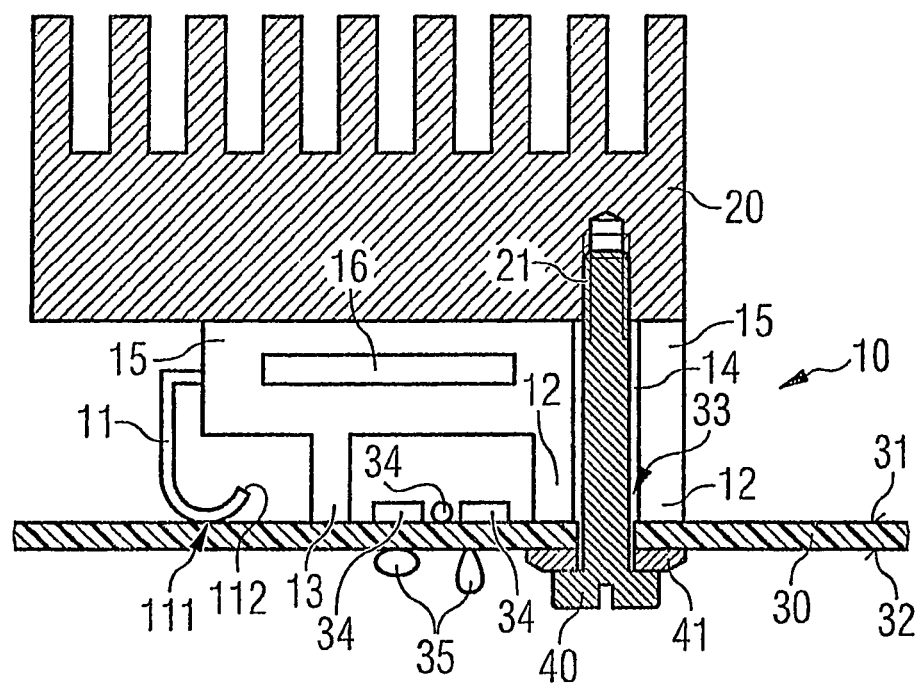
FIG. 4 shows a cross section through-a component arrangement according to the invention in which the fastening element is arranged at the edge of the electronics module.

In general, however, it is similarly possible when only a single fastening means 40 is used to arrange it in a corresponding way in the edge region of the electronics module 10. An arrangement of this type is advantageous in particular whenever the production of an expensive bore or clearance in an assembly, for example in a substrate of a power section 16, can be avoided. Such an arrangement is represented in FIG. 4.

In the case of the fastening means presented so far, only screws have been described. Instead of this, however, any desired fastening means known in the art can be used, such as for example clips, rivets or latching lugs. In particular when clips are used, it is advantageous if the electronics module 10 has one or more receptacles 14, as represented in FIG. 4.

Figure 5:
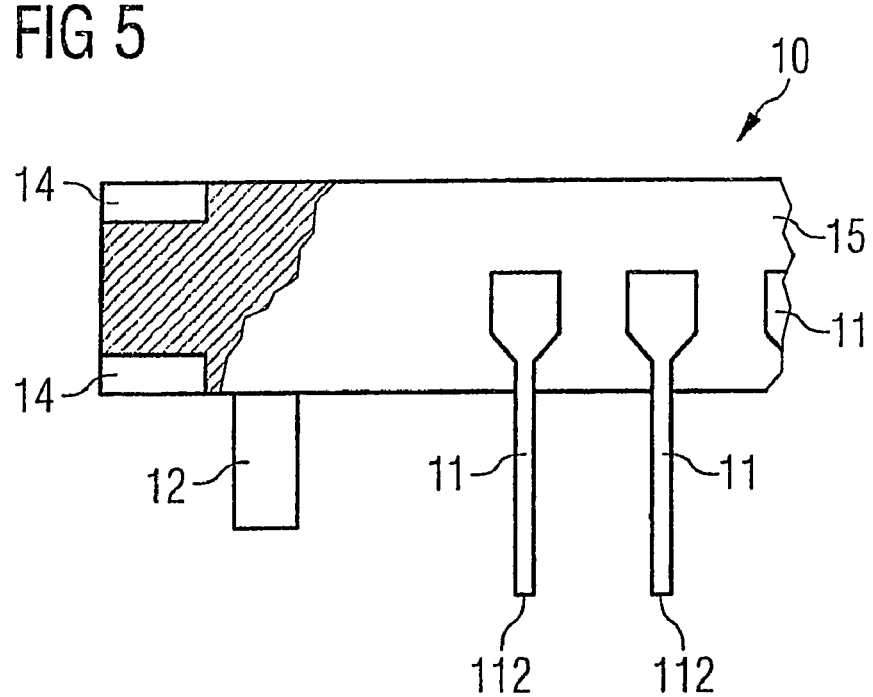
FIG. 5 shows a portion of a solder-free contactable electronics module with a receptacle for a mounting clip in a partially broken-open side view.

FIG. 5 shows a portion of an electronics module in side view, looking in the direction of the leads 11. The package 15 is represented as partially broken open, so that two receptacles 14 formed as depressions can be seen. Instead of a screw, as represented in FIG. 4, a fastening spring may engage in these receptacles and connect a printed circuit board 30, the electronics module 10 and also a heat sink to one another by its spring force. As a result of the great spring excursions that can be achieved with fastening springs of this type, it is possible to compensate for changes in spacing caused in particular by creep properties of a thermally conductive paste that is optionally introduced between the heat sink 20 and the package 15.

In order to ensure proper contacting of the electronics module with the printed circuit board, the leads must be formed in a suitable way. According to a preferred embodiment, the leads are formed as continuations of a metallic carrier strip (leadframe).

Figure 6:
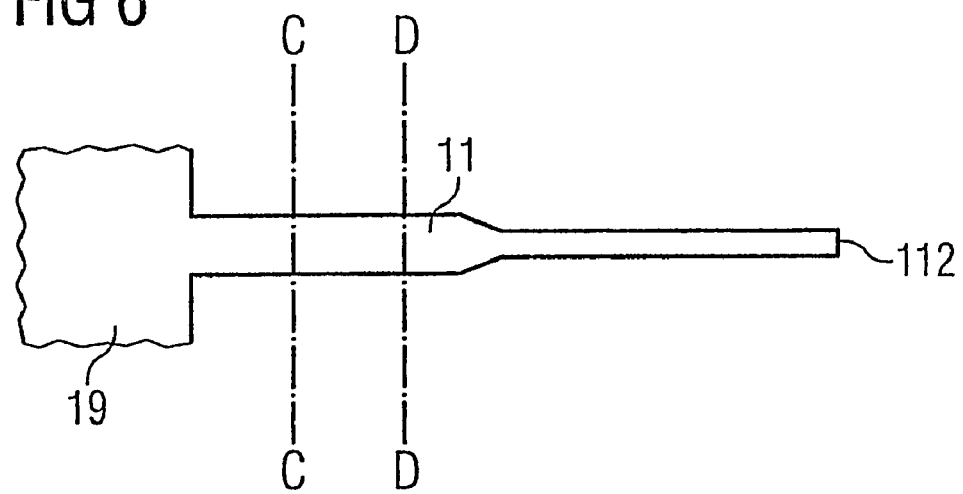
FIG. 6 shows an elastic lead.

A lead of this type is represented in FIG. 6. The lead 11 is formed elastically and as a continuation of a carrier strip 19. The lead 11 is formed with preference as a spring and preferably has a high level of stiffness. A copper-beryllium bronze is suitable for example as the material for producing the spring leads 11. In order to achieve good electrical contacting of the lead 11, it is advantageous to coat it with an electrically conducting material, for example gold or other noble metals, tin or alloys of these metals.

In order that the lead 11 has the form shown in FIGS. 1, 2, 4, it must be bent from the planar form that is represented. A first level C identifies the later limit of the package, for example after the encapsulation or embedding of the electronics module with a molding or embedding compound forming the package 15. The bending of the lead 11 by an angle of preferably 90° is produced in the region of the level D.

While the invention disclosed herein has been described in terms of several preferred embodiments, there are numerous alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A component arrangement comprising:
    an electronics module;
    a heat sink contacting the electronics module;
    a printed circuit board; and
    a fastener fastening the electronics module to the printed circuit board and the heat sink;
    wherein the electronics module comprises,
        at least one elastic lead providing a solder-free contact between the electronics module and the printed circuit board;
        a receptacle receiving the fastener, and
        a decoupler decoupling a compressive force between the lead and the printed circuit board from a pressing force between the heat sink and the electronics module; and
    wherein the decoupler comprises a first spacer and at least one second spacer, and
    wherein each lead of the at least one elastic lead includes a curved portion and a free end, the curved portion contacting a metallization on the printed circuit board to provide the solder-free contact, the free end being spaced apart from the printed circuit board by the curved portion.

2. The component arrangement of claim 1, wherein the first spacer and the at least one second spacer are arranged with positive engagement between the heat sink and the printed circuit board.

3. The component arrangement of claim 1, wherein the fastener is formed as a screw or as a spring clip.

4. The component arrangement of claim 1, wherein the receptacle is formed as a bore or as a groove.

5. The component arrangement of claim 1, wherein a first spacing between one lead of the at least one elastic lead and the first spacer is greater than a second spacing between the one lead and the at least one second spacer.

6. The component arrangement of claim 5, wherein the length of the first spacer is greater than or equal to the length of the at least one second spacer.

7. The component arrangement of claim 5, wherein at least one electronic component is connected to the printed circuit board and is arranged between the first spacer and the at least one second spacer.

8. The component arrangement of claim 1, wherein the at least one elastic lead is formed as a spring.

9. The component arrangement of claim 1, wherein the electronics module comprises a package.

10. The component arrangement of claim 9, wherein the at least one lead does not extend beyond the package in a lateral direction.

11. The component arrangement as claimed in claim 9, wherein at least part of the decoupler is formed in one piece with the package.

12. The component arrangement of claim 1, wherein the printed circuit board has a maximum resistance to pressure of between 120 N/mm$^2$ and 200 N/mm$^2$.

13. An electronics module configured for electrical contacted with a printed circuit board and thermal contact with a heat sink, the electronics module, printed circuit board and heat sink fastened by a fastener, the electronics module comprising:
   at least one elastic lead configured to provide a solder-free contact between the electronics module and the printed circuit board;
   a receptacle configured to receive the fastener; and
   a decoupler configured to decouple a compressive force between the at least one elastic lead and the printed circuit board from a pressing force between the heat sink and the electronics module; and
   wherein the decoupler comprises a first spacer and at least one second spacer, and
   wherein each lead of the at least one elastic lead includes a curved portion and a free end, the curved portion contacting the printed circuit board to provide the solder-free contact, the free end being spaced apart from the printed circuit board by the curved portion.

14. An electrical component arrangement comprising:
   a heat sink;
   an electronics module in thermal contact with the heat sink, the electronics module including a package, at least one lead extending from the package, a receptacle formed in the package, and a spacer extending from the package;
   a printed circuit board in electrical contact with the electronics module through a solder-free contact with the at least one lead, the printed circuit board separated from the package of the electronics module by the spacer; and
   a fastener positioned in the receptacle of the electronics module, the fastener fastening the electronics module to the printed circuit board and the heat sink,
   wherein the spacer decouples a compressive force between the at least one lead and the printed circuit board from a pressing force between the heat sink and the electronics module; and
   wherein the spacer comprises a first spacer and at least one second spacer, and
   wherein each lead of the at least one elastic lead includes a curved portion and a free end, the curved portion contacting a metallization on the printed circuit board to provide the solder-free contact, the free end being spaced apart from the printed circuit board by the curved portion.

15. The electrical component arrangement of claim 14 wherein the first spacer extends from a first position on the package and the at least one second spacer extending from a second position on the package.

16. The electrical component arrangement of claim 15 wherein the first spacer is of a different length than the at least one second spacer.

17. The electrical component arrangement of claim 14 wherein the first spacer and the at least one second spacer are comprised of an elastic material.

18. The electrical component arrangement of claim 14 wherein the first spacer and the at least one second spacer includes a continuation that engages a bore in the printed circuit board.

19. The electrical component arrangement of claim 14 wherein the fastener comprises a screw extending through the printed circuit board and the receptacle in the package and into the heat sink.

20. A component arrangement comprising:
   an electronics module;
   a heat sink in contact with the electronics module;
   a printed circuit board; and
   means for fastening the electronics module with the printed circuit board and the heat sink;
   wherein the electronics module comprises,
      an elastic lead configured to provide a solder-free contact of the electronics module with the printed circuit board,
      a receptacle configured to receive the means for fastening, and
      means for decoupling a compressive force between the lead and the printed circuit board from a pressing force between the heat sink and the electronics module; and wherein the means for decoupling comprises a first spacer and at least one second spacer, and
   wherein each lead of the at least one elastic lead includes a curved portion and a free end, the curved portion contacting a metallization on the printed circuit board to provide the solder-free contact, the free end being spaced apart from the printed circuit board by the curved portion.

* * * * *